(12) United States Patent
Camacho et al.

(10) Patent No.: US 8,420,508 B2
(45) Date of Patent: Apr. 16, 2013

(54) INTEGRATED CIRCUIT PACKAGING SYSTEM WITH BUMP CONTACT ON PACKAGE LEADS AND METHOD OF MANUFACTURE THEREOF

(75) Inventors: Zigmund Ramirez Camacho, Singapore (SG); Henry Descalzo Bathan, Singapore (SG); Emmanuel Espiritu, Singapore (SG)

(73) Assignee: Stats Chippac Ltd., Singapore (SG)

( * ) Notice: Subject to any disclaimer, the term of this patent is extended or adjusted under 35 U.S.C. 154(b) by 298 days.

(21) Appl. No.: 12/726,342

(22) Filed: Mar. 17, 2010

(65) Prior Publication Data

US 2011/0227211 A1    Sep. 22, 2011

(51) Int. Cl.
*H01L 21/00* (2006.01)
(52) U.S. Cl.
USPC .......................................... 438/464; 438/123
(58) Field of Classification Search .................. 438/123, 438/464
See application file for complete search history.

(56) References Cited

U.S. PATENT DOCUMENTS

| | | | |
|---|---|---|---|
| 5,557,150 A | 9/1996 | Variot et al. | |
| 5,976,912 A | 11/1999 | Fukutomi et al. | |
| 6,001,671 A | 12/1999 | Fjelstad | |
| 6,093,584 A | 7/2000 | Fjelstad | |
| 6,238,952 B1 | 5/2001 | Lin | |
| 6,261,864 B1 | 7/2001 | Jung et al. | |
| 6,306,685 B1 | 10/2001 | Liu et al. | |
| 6,331,729 B1 * | 12/2001 | Yusa et al. | 257/678 |
| 6,342,730 B1 | 1/2002 | Jung et al. | |
| 6,498,099 B1 | 12/2002 | McLellan et al. | |
| 6,700,188 B2 | 3/2004 | Lin | |
| 7,049,177 B1 | 5/2006 | Fan et al. | |
| 7,192,808 B2 * | 3/2007 | Saitoh | 438/123 |
| 8,003,444 B2 * | 8/2011 | Takai et al. | 438/123 |
| 8,089,145 B1 * | 1/2012 | Kim et al. | 257/690 |
| 2004/0152241 A1 * | 8/2004 | Usui et al. | 438/123 |
| 2005/0263864 A1 * | 12/2005 | Islam et al. | 257/676 |
| 2007/0059863 A1 | 3/2007 | Li et al. | |
| 2007/0181983 A1 | 8/2007 | Takai et al. | |
| 2008/0067649 A1 | 3/2008 | Matsunaga et al. | |
| 2008/0290485 A1 | 11/2008 | Shim et al. | |
| 2009/0194854 A1 * | 8/2009 | Tan et al. | 257/666 |
| 2009/0309207 A1 | 12/2009 | Chow et al. | |
| 2011/0140253 A1 * | 6/2011 | Lee et al. | 257/676 |
| 2011/0201159 A1 * | 8/2011 | Mori et al. | 438/123 |
| 2012/0038036 A1 * | 2/2012 | Chun et al. | 257/677 |

OTHER PUBLICATIONS

Ramos et al., "The Method of Making Low-Cost Multiple-Row QFN", 32nd IEEE/CPMT International Electronics Manufacturing Technology Symposium, Oct. 3-7, 2007, pp. 261-267, San Jose, CA.

* cited by examiner

*Primary Examiner* — James Mitchell
(74) *Attorney, Agent, or Firm* — Ishimaru & Associates LLP (57) ABSTRACT

A method of manufacture of an integrated circuit packaging system includes: providing a base panel having a first side with a cavity and a second side opposite the first side; connecting an integrated circuit device and the first side; applying a resist mask having an opening on the second side, the opening offset from the cavity; forming a bump contact in the opening; applying an encapsulation in the cavity over the integrated circuit device and the first side; and forming a package lead by removing a portion of the base panel under the cavity, a flared tip of the package lead intersecting a base side of the encapsulation.

7 Claims, 6 Drawing Sheets

FIG. 17

INTEGRATED CIRCUIT PACKAGING SYSTEM WITH BUMP CONTACT ON PACKAGE LEADS AND METHOD OF MANUFACTURE THEREOF

TECHNICAL FIELD

The present invention relates generally to an integrated circuit packaging system, and more particularly to a leaded package system.

BACKGROUND ART

Market growth for high density and high output/input integrated circuit packages has resulted in a trend for electronic products that are lightweight, smaller in size, multi-functional, and with ever increasing higher speeds. Electronic products such as cell phone base products, global positioning systems (GPS), satellites, communication equipment, consumer products, and a vast line of other similar products are in ever increasing global demand.

It is very important for products to continue to improve in features, performance, and reliability while reducing product costs, product size, and equally important to be available quickly for purchase by the consumers or buyers. Products must compete in world markets and attract many consumers or buyers in order to be successful.

Smaller packages need to be electrically connected with other parts and components. As the smaller packages with more circuits continue to get shrink in size, there is a greater need to produce the smaller packages with more and more package connectors to support continually increasing amounts of electrical connections to and from those smaller packages.

Thus, an increasing need remains to increase the electrical connections of packages as the sizes of the packages continue to shrink in size while the circuits inside those packages continue to increase. It is also critical that the electrical connections are created and placed with precision so that each of the electrical connections can be spaced apart from one another. The smaller packages and their electrical connections must be able to be connected to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides providing a base panel having a first side with a cavity and a second side opposite the first side; connecting an integrated circuit device and the first side; applying a resist mask having an opening on the second side, the opening offset from the cavity; forming a bump contact in the opening; applying an encapsulation in the cavity over the integrated circuit device and the first side; and forming a package lead by removing a portion of the base panel under the cavity, a flared tip of the package lead intersecting a base side of the encapsulation.

The present invention provides a package lead having a flared tip; a bump contact on the package lead; an integrated circuit device connected to the package lead; and an encapsulation having a base side intersecting the flared tip, the encapsulation covering the integrated circuit device and a portion of the package lead, the bump contact exposed from the base side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 1:
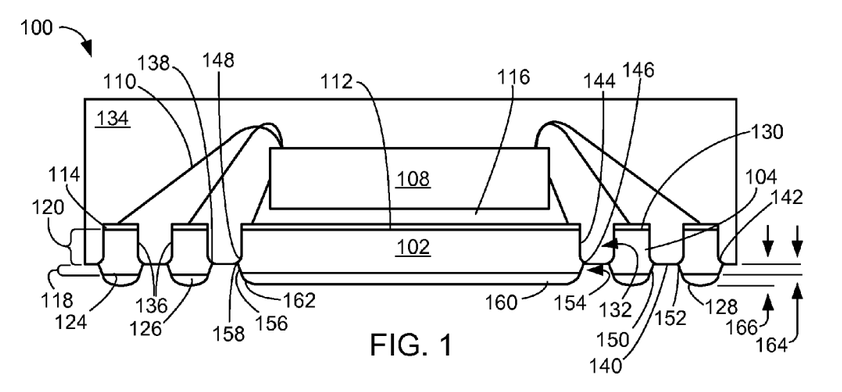
FIG. 1 is a cross-sectional view of an integrated circuit packaging system taken along a line 1-1 of FIG. 2 in a first embodiment of the present invention.
Figure 2:
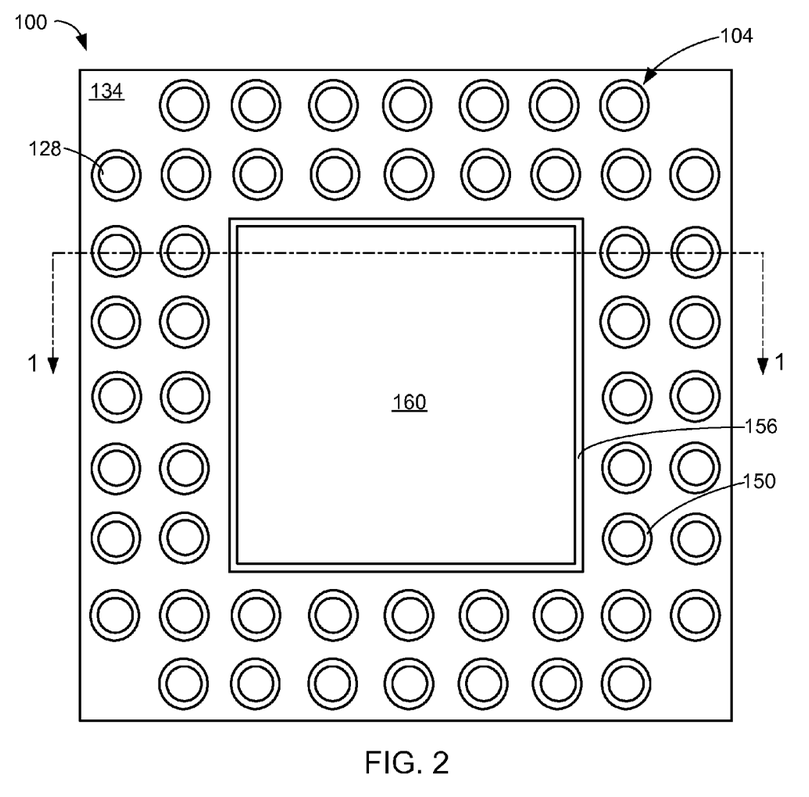
FIG. 2 is a bottom view of the integrated circuit packaging system of FIG. 1.

Referring now to FIG. 1, therein is shown a cross-sectional view of an integrated circuit packaging system 100 taken along a line 1-1 of FIG. 2 in a first embodiment of the present invention. The integrated circuit packaging system 100 can include a die pad 102, package leads 104, an integrated circuit device 108, and internal interconnects 110.

The integrated circuit device 108 can be a wire bond chip, a package, or passive device. The die pad 102 can be formed from a copper material or conductive materials and include a component side 112 covered with a pre-plated layer 114 of material that can include a silver, a noble metal, or a pre-plating frame material.

The integrated circuit device 108 can be mounted over the component side 112 using an attachment layer 116 that can be a conductive adhesive or film. The die pad 102 can provide electrical or thermal connectivity between the integrated circuit device 108 and sides of the die pad 102.

The package leads 104 can be formed from the same material as the die pad 102 or the copper material or other conductive materials. The package leads 104 are individually formed having an outward part 118 and an inward part 120 centrally aligned, as an example, with the outward part 118. The package leads 104 can be oriented around the die pad 102 and in-line with the die pad 102.

The outward part 118 includes an outward flat end 124 covered with a bump contact 126 that can be formed from a conductive plating material including a tin, a solder, or a nickel material. The bump contact 126 can be formed having a bump convex surface 128, such as a curved or spherical surface. The bump convex surface 128 of the bump contact 126 can preferably protrude away from the outward flat end 124. The outward flat end 124 can be coplanar with a side of the die pad 102 opposite the component side 112.

The inward part 120 includes an inward end 130 opposite the outward flat end 124 of the outward part 118. The inward end 130 can be coplanar with the component side 112. The internal interconnects 110, including bond wires or ribbon bond wires, can connect the pre-plated layer 114 of the package leads 104 with the integrated circuit device 108.

The inward part 120, the internal interconnects 110, the pre-plated layer 114, the attachment layer 116, the integrated circuit device 108, and an inward portion 132 of the die pad 102 can be encapsulated with an encapsulation 134. The encapsulation 134 provides protection to the integrated circuit packaging system 100 using materials that can include an epoxy, an epoxy blend, a silicone, a polymide, or a molding material.

Inward sides 136 of the inward part 120 includes an inward edge 138. The inward edge 138 intersects a plane containing a base side 140 of the encapsulation 134. An edge of the inward sides 136 opposite the inward edge 138 intersects the inward end 130 of the package leads 104.

The inward sides 136 and the inward edge 138 are joined together with a flared tip 142. The flared tip 142 can be formed curving, spreading, or tapering away from the inward part 120.

The inward portion 132 of the die pad 102 includes inward paddle sides 144. The inward paddle sides 144 includes an inward paddle edge 146. The inward paddle edge 146 intersects the plane containing the base side 140. An edge of the inward paddle sides 144 opposite the inward paddle edge 146 intersects the component side 112 of the die pad 102.

A portion of the inward paddle sides 144 along the inward paddle edge 146 includes a flared pad tip 148. The flared pad tip 148 can be formed curving, spreading, or tapering away from the inward portion 132.

Outward sides 150 of the outward part 118 includes an outward edge 152. The outward sides 150 can have a planar surface. The outward sides 150 can be oriented non-horizontally and exposed from the base side 140 of the encapsulation 134. The outward edge 152 intersects the plane containing the base side 140 and the inward edge 138. An edge of the outward sides 150 opposite the outward edge 152 intersects the outward flat end 124. The outward sides 150 can be formed and oriented having an obtuse angle or an orthogonal angle relative to the base side 140.

An outward portion 154 of the die pad 102 includes outward paddle sides 156 exposed from the base side 140 of the encapsulation 134. The outward paddle sides 156 are non-horizontal and include an outward paddle edge 158. The outward paddle edge 158 intersects the plane containing the base side 140. An edge of the outward paddle sides 156 opposite the outward paddle edge 158 intersects a side of the die pad 102 opposite the component side 112. The outward paddle sides 156 can be formed having an obtuse angle or an orthogonal angle relative to the base side 140.

The side of the die pad 102 opposite the component side 112 can be covered with a pad contact layer 160 preferably identical to the conductive plating material used to form the bump contact 126 of the outward part 118. The pad contact layer 160 can include pad layer edges 162 having rounded corners.

The outward part 118 and the outward portion 154 of the die pad 102 can have a minimum standoff height 164 from the base side 140. The minimum standoff height 164 is defined as a vertical distance between the base side 140 of the outward part 118 and the outward flat end 124 or between the base side 140 and the side of the die pad 102 opposite the component side 112.

The bump convex surface 128 and the pad contact layer 160 facing away from the die pad 102 can have a maximum standoff height 166 from the base side 140. The maximum standoff height 166, is defined as a vertical distance between the base side 140 and the bump convex surface 128 or between a side of the pad contact layer 160 facing away from the die pad 102 and the base side 140.

It has been discovered that the present invention provides the integrated circuit packaging system 100 with improvements in convection cooling capabilities. The package leads 104 with the outward part 118 provide the minimum standoff height between the integrated circuit packaging system 100 and the assembly surface resulting in a substantial improvement in free-air cooling capacity between the integrated circuit packaging system 100 and a next level subsystem (not shown).

It has also been discovered that the present invention provides the integrated circuit packaging system 100 with improvements in electrical connectivity to a mounting structure (not shown). The package leads 104 with the outward sides 150 provide optimized surface contact characteristics with the solder structure resulting in low impedance connections. The package leads 104 with the bump contact 126 having the bump convex surface 128 provide increased penetration with optimum surface contact resulting in a secure electrical and mechanical connection to the solder structure. The pad contact layer 160 provides surface contact to the solder structure resulting in a low impedance connection. The rounded corners of the pad layer edges 162 provide increased penetration with optimum surface contact resulting in strong mechanical connection to the solder structure. The plating of a tin, a solder, or a nickel material on the outward part 118 of the package leads 104 protects the leads from oxidation and corrosion and improves both the storage life and deferred solder connective capabilities of the package leads 104.

It has further been discovered that the present invention provides the integrated circuit packaging system 100 with improved thermal dissipation capabilities. The pad contact layer 160 provides exceptional surface area to increase the transfer of heat from the integrated circuit packaging system 100 to a heat sink (not shown). The rounded corners of the pad layer edges 162 provide increased penetration with optimum surface contact resulting in a secure electrical and mechanical connection to the heat sink.

Referring now to FIG. 2, therein is shown a bottom view of the integrated circuit packaging system of FIG. 1. The outward paddle sides 156 are shown around and in direct contact with the pad contact layer 160. The encapsulation 134 is shown around and in direct contact with the outward paddle sides 156.

The outward sides 150 of the package leads 104 are shown exposed and distributed on the encapsulation 134. Each of the outward sides 150 are shown around and in direct contact with the bump convex surface 128 exposed above the outward sides 150.

Figure 3:
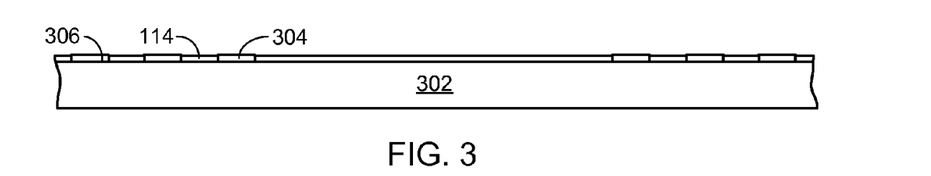
FIG. 3 is the structure of FIG. 1 in a base plating phase of manufacture.

Referring now to FIG. 3, therein is shown the structure of FIG. 1 in a base plating phase of manufacture. A base panel 302 can be formed from copper and is shown with a plating mask 304 applied to a first side 306 of the base panel 302. The plating mask 304 can be used to cover user specified areas on the base panel 302 to be excluded from plating.

The areas of the first side 306 exposed around the plating mask 304 are covered with the pre-plated layer 114 during the base plating phase. The base plating phase can include a plating process with an electroplating, a diffusion, a precipitation, or a vaporization process.

Figure 4:
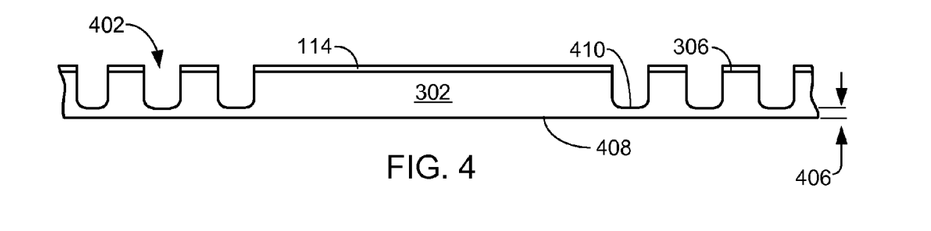
FIG. 4 is the structure of FIG. 3 in a half etching phase.

Referring now to FIG. 4, therein is shown the structure of FIG. 3 in a half etching phase. The plating mask 304 of FIG. 3 can be removed and portions of the base panel 302 not covered by the pre-plated layer 114 can be removed during the half etching phase. The half etching phase can include an etching process to form cavities 402 in the base panel 302.

The cavities 402 can include holes, which partially penetrates the base panel 302 from the first side 306 and separated by areas of the first side 306 covered by the pre-plated layer 114.

The portions of the base panel 302 removed to form the cavities 402 can be used to control a panel thickness 406 of a portion of the base panel 302 remaining below the cavities 402. The panel thickness 406 is defined as a thickness between a second side 408 of the base panel 302 opposite the first side 306 and a bottom surface 410 within each of the cavities 402. The portion of the base panel 302 transversing a planar area of the base panel 302 below the cavities 402 can be used to determine the minimum standoff height.

Figure 5:
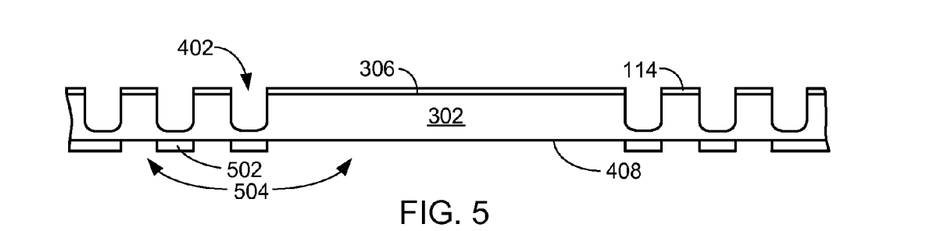
FIG. 5 is the structure of FIG. 4 in a resist applying phase.

Referring now to FIG. 5, therein is shown the structure of FIG. 4 in a resist applying phase. A resist mask 502, including a dry film resist or a dry film mask, can be applied on the second side 408 during the resist applying phase and oriented below the cavities 402.

The resist applying phase can include the use of a lamination, an exposure, a coversheet removal, and an aqueous development process. The resist mask 502 can be oriented directly under the cavities 402 in the base panel 302 and include openings 504 exposing the second side 408 from the resist mask 502. The openings 504 can be below the pre-plated layer 114.

Figure 6:
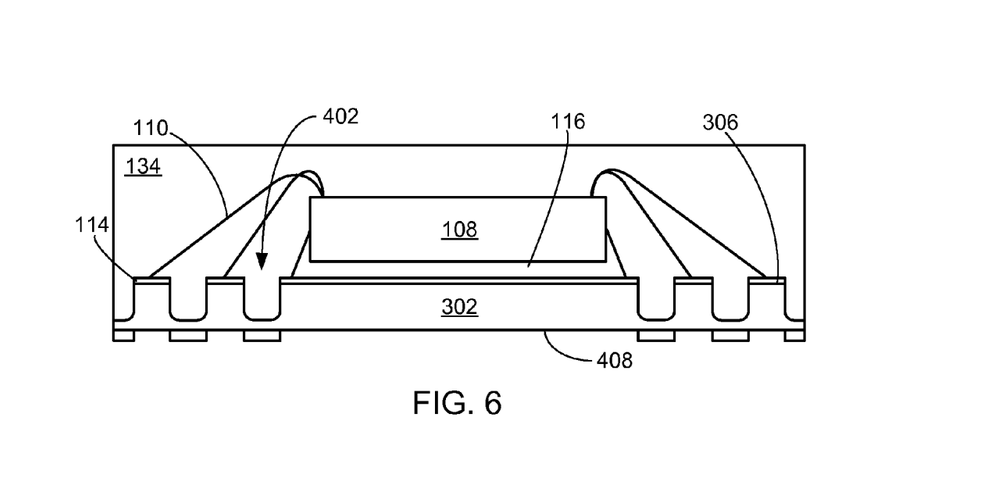
FIG. 6 is the structure of FIG. 5 in a connecting phase.

Referring now to FIG. 6, therein is shown the structure of FIG. 5 in a connecting phase. The connecting phase includes processes of mounting the integrated circuit device 108, attaching the internal interconnects 110, and applying the encapsulation 134. The integrated circuit device 108 can be mounted on a portion of the pre-plated layer 114 oriented over the first side 306 using the attachment layer 116.

The internal interconnects 110 can be attached and connect portions of the pre-plated layer 114 surrounding the portion of the pre-plated layer 114 having the attachment layer 116 to a side opposite an active side of the integrated circuit device 108. The encapsulation 134 can be applied in and over the cavities 402 of the base panel 302 covering the attachment layer 116, the pre-plated layer 114, the integrated circuit device 108, and the internal interconnects 110. The cavities 402 of the base panel 302 are filled with the encapsulation 134.

As an example, the sides of the encapsulation 134 and edges of the base panel 302 can be shaped, formed, or singulated after the encapsulation 134 has been applied and cured. Yet another example, the edges of the base panel 302 can be singulated and then an encapsulant mold (not shown) can be used to form and contain sides of the encapsulation 134 to have a vertical orientation with respect to the second side 408. The sides of the encapsulation 134 can be coplanar with the edges of the base panel 302.

Figure 7:
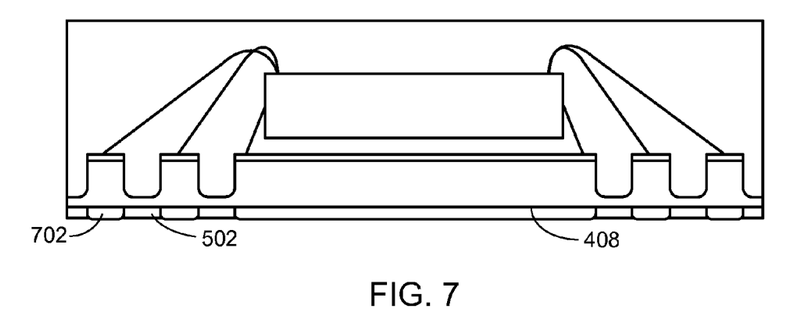
FIG. 7 is the structure of FIG. 6 in a plating phase.

Referring now to FIG. 7, therein is shown the structure of FIG. 6 in a plating phase. A plating layer 702 formed in the openings 504 of FIG. 5 using the conductive plating material preferably identical to material of the bump contact 126 of FIG. 1 and the pad contact layer 160 of FIG. 1.

The plating layer 702 can be applied on the second side 408 exposed in the openings 504 of the resist mask 502 during the plating phase. The plating phase can include a plating process with an electroplating, a diffusion, a precipitation, or a vaporization process.

It has been discovered that the resist mask 502 improves the capability to provide additional standoff height for integrated circuit packaging systems having the present invention. The resist mask 502 can be a thick layer to provide a deep containment area to support large amounts of the plating layer 702 resulting in a thick build-up layer of the plating layer 702.

The thick build-up layer of the plating layer 702 provides an additional standoff height beyond the panel thickness 406 of FIG. 4.

Figure 8:
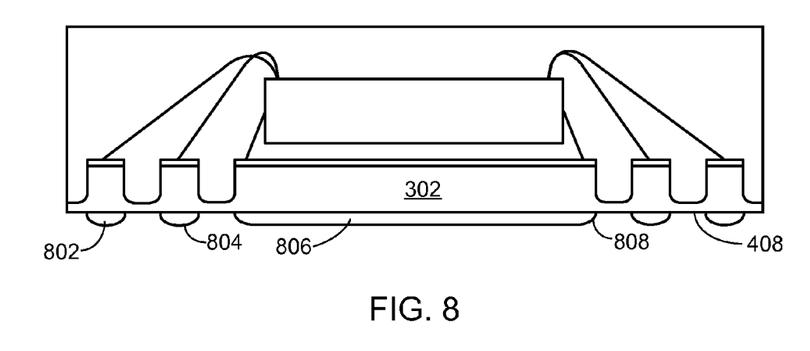
FIG. 8 is the structure of FIG. 7 in a resist removal phase.

Referring now to FIG. 8, therein is shown the structure of FIG. 7 in a resist removal phase. The resist mask 502 of FIG. 7 can be removed during the resist removal phase. The resist removal phase includes an etching process to remove the resist mask 502 to expose the second side 408 of the base panel 302.

Plating bumps 802 having a convex surface 804 around a layer 806 on the second side 408 can be formed by etching the plating layer 702 of FIG. 7 using the etching process. The layer 806 can include edges 808 with rounded corners. The plating bumps 802 are separated from one another and from the layer 806.

Figure 9:
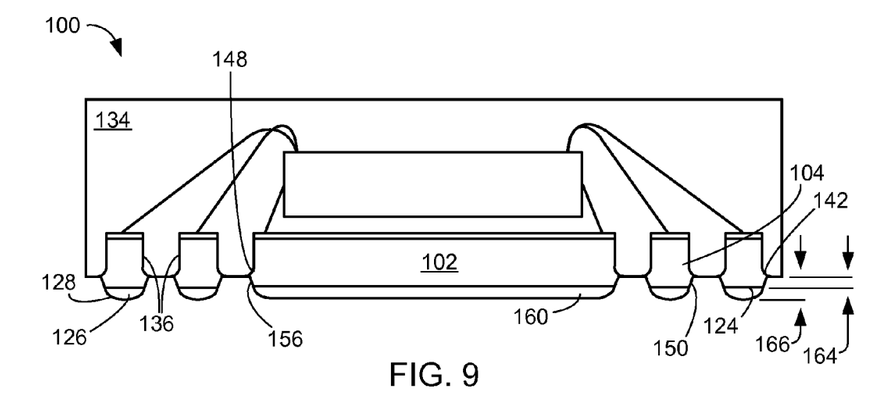
FIG. 9 is the structure of FIG. 8 in back etching phase.

Referring now to FIG. 9, therein is shown the structure of FIG. 8 in back etching phase. The base panel 302 of FIG. 8 exposed around the plating bumps 802 of FIG. 8 and the layer 806 of FIG. 8 can be etched using an etching process to remove portions of the second side 408 and the encapsulation 134 during the back etching phase.

The layer 806 and the plating bumps 802 limit removal of portions of the base panel 302 over the layer 806 and the plating bumps 802 during the back etching phase. The portions of the base panel 302 over the layer 806 and the plating bumps 802 unaffected by the back etching phase can have the panel thickness 406 of FIG. 4.

As an example, copper material of the base panel 302, covered by the plating bumps 802 and the layer 806 formed from the plating layer 702 of FIG. 7, can be subjected to the etching process to attack the plating bumps 802 and the layer 806 much less aggressively than the copper material exposed from the plating bumps 802 and the layer 806.

The following chemical reaction equations show that an alkaline etchant in a controlled pH range will attack tin, solder, or nickel much less aggressively than the copper of the base panel 302.

The Regeneration Reaction:

The ammonia (NH3) and the ammonium chloride (NH4Cl) are provided by the replenisher solution. The oxygen comes from the air brought into the etch chamber by the ventilation system.

The base panel 302 can be etched during the etching process to form the package leads 104, the die pad 102, and the minimum standoff height 164. The package leads 104 include the outward sides 150 and the flared tip 142 of the inward sides 136. The die pad 102 include the outward paddle sides 156 and the flared pad tip 148.

As a result of the much less aggressive etching of the tin, solder, or nickel, the plating bumps 802 are formed into the bump contact 126 on the package leads 104 and the convex surface 804 of FIG. 8 is formed into the bump convex surface 128 of the bump contact 126. Similarly, the layer 806 is formed into the pad contact layer 160 as a result of the much less aggressive etching of the tin, solder, or nickel. The maximum standoff height 166 of the integrated circuit packaging system 100 is a result of the etching process applied to the base panel 302 and the bump contact 126 formed from the plating bumps 802.

The outward flat end 124 of the package leads 104 is formed from portions of the second side 408 covered by the bump contact 126 and isolated by the attack of copper during the etching. The minimum standoff height 164 can be identical to the panel thickness 406 of FIG. 4 as a result of the application of the plating bumps 802 and the layer 806 applied on the base panel 302 and the controlled pH range of the etchant on copper covered with the plating layer 702 during the etching process.

Figure 10:
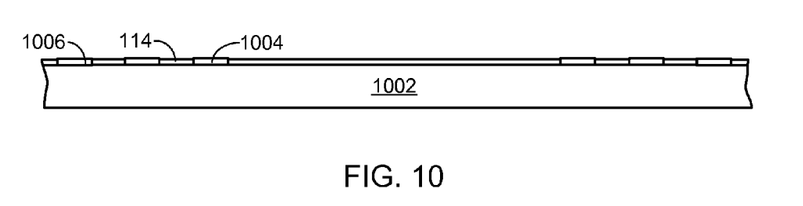
FIG. 10 is the structure of FIG. 1 in a base plating phase in a second embodiment of manufacture.

Referring now to FIG. 10, therein is shown the structure of FIG. 1 in a base plating phase in a second embodiment of manufacture. A base panel 1002 formed from copper is shown with a plating mask 1004 applied to a first side 1006 of the base panel 1002. The plating mask 1004 can be used to cover user specified areas on the base panel 1002 to be excluded from plating. The areas of the first side 1006 exposed around the plating mask 1004 are covered with the pre-plated layer 114 during the base plating phase using the plating process.

Figure 11:
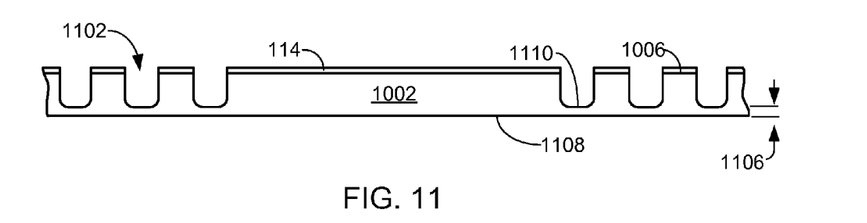
FIG. 11 is the structure of FIG. 10 in a half etching phase.

Referring now to FIG. 11, therein is shown the structure of FIG. 10 in a half etching phase. The plating mask 1004 of FIG. 10 can be removed and portions of the base panel 1002 not covered by the pre-plated layer 114 can be removed during the half etching phase. The half etching phase can include the etching process to form cavities 1102 in the base panel 1002.

The cavities 1102 can include holes, which partially penetrates the base panel 1002 from the first side 1006 and separated by areas of the first side 1006 covered by the pre-plated layer 114.

The portions of the base panel 1002 removed to form the cavities 1102 can be used to control a panel thickness 1106 of a portion of the base panel 1002 remaining below the cavities 1102. The panel thickness 1106 is defined as a thickness between a second side 1108 of the base panel 1002 opposite the first side 1006 and a bottom surface 1110 within each of the cavities 1102. The portion of the base panel 1002 transversing a planar area of the base panel 1002 below the cavities 1102 can be used to determine the minimum standoff height.

Figure 12:
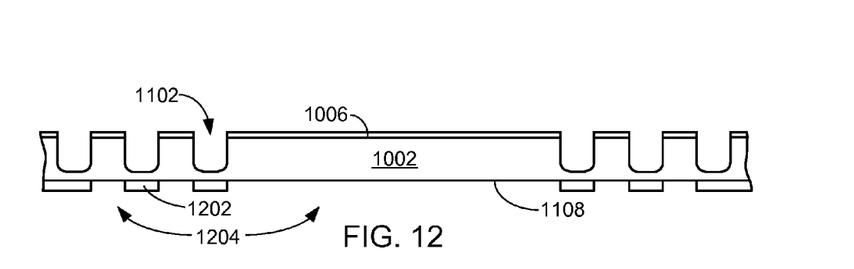
FIG. 12 is the structure of FIG. 11 in a resist applying phase.

Referring now to FIG. 12, therein is shown the structure of FIG. 11 in a resist applying phase. A resist mask 1202, including a dry film resist or a dry film mask, can be applied on the second side 1108 during the resist applying phase and oriented below the cavities 1102.

The resist applying phase can include the use of a lamination, an exposure, a coversheet removal, and an aqueous development process. The resist mask 1202 can be oriented directly under the cavities 1102 in the base panel 1002 and include openings 1204 exposing the second side 1108 from the resist mask 1202. The openings 1204 can be below the pre-plated layer 114.

Figure 13:
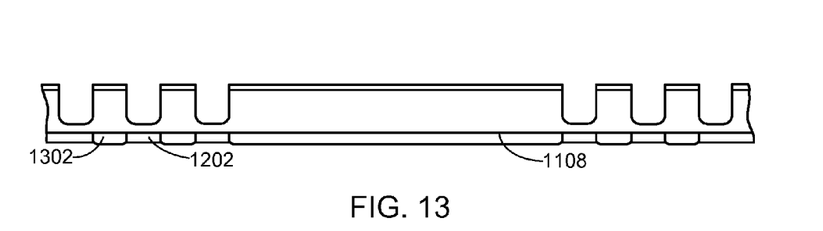
FIG. 13 is the structure of FIG. 12 in a plating phase.

Referring now to FIG. 13, therein is shown the structure of FIG. 12 in a plating phase. A plating layer 1302 formed in the openings 1204 of FIG. 12 using the conductive plating material preferably identical to the material of the bump contact 126 of FIG. 1 and the pad contact layer 160 of FIG. 1.

The plating layer 1302 can be applied on the second side 1108 exposed in the openings 1204 around the resist mask 1202 during the plating phase. The plating phase can include use of the plating process.

It has been discovered that the resist mask 1202 improves the capability to provide additional standoff height for an integrated circuit packaging system having the present invention. The resist mask 1202 can be a thick layer to provide a deep containment area to support large amounts of the plating layer 1302 resulting in a thick build-up layer of the plating layer 1302. The thick build-up layer of the plating layer 1302 provides an additional standoff height beyond the panel thickness 1106 of FIG. 11.

Figure 14:
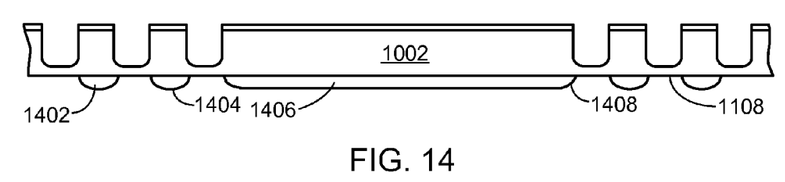
FIG. 14 is the structure of FIG. 13 in a resist removal phase.

Referring now to FIG. 14, therein is shown the structure of FIG. 13 in a resist removal phase. The resist mask 1202 of FIG. 13 can be removed during the resist removal phase. The resist removal phase includes the etching process to remove the resist mask 1202 to expose the second side 1108 of the base panel 1002.

Plating bumps 1402 having a convex surface 1404 around a layer 1406 on the second side 1108 can be formed by etching the plating layer 1302 of FIG. 13 using the etching process. The layer 1406 can include edges 1408 with rounded corners. The plating bumps 1402 are separated from one another and from the layer 1406.

Figure 15:
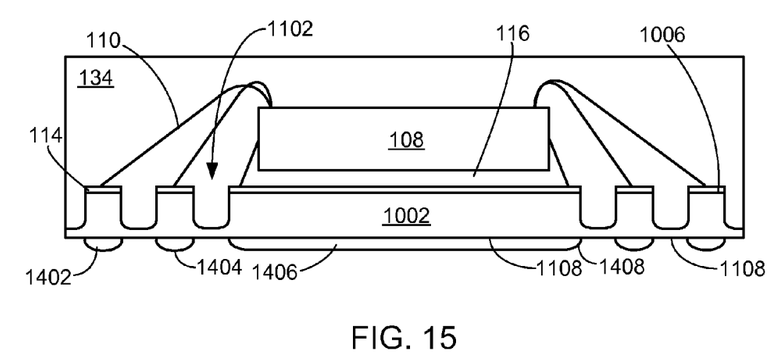
FIG. 15 is the structure of FIG. 14 in a connecting phase.

Referring now to FIG. 15, therein is shown the structure of FIG. 14 in a connecting phase. The connecting phase includes processes of mounting the integrated circuit device 108, attaching the internal interconnects 110, singulating the edges of the base panel 1002 of FIG. 14, and applying the encapsulation 134. The integrated circuit device 108 can be mounted on a portion of the pre-plated layer 114 oriented over the first side 1006 using the attachment layer 116.

The internal interconnects 110 can be attached and connect portions of the pre-plated layer 114 surrounding the portion of the pre-plated layer 114 having the attachment layer 116 to an side opposite an active side of the integrated circuit device 108. The encapsulation 134 can be applied in and over the cavities 1102 of the base panel 1002, the attachment layer 116, the pre-plated layer 114, the integrated circuit device 108, and the internal interconnects 110.

The cavities 1102 of the base panel 1002 are filled with the encapsulation 134. As an example, the sides of the encapsulation 134 and edges of the base panel 1002 can be shaped, formed, or singulated after the encapsulation 134 has been applied and cured. Yet another example, the edges of the base panel 1002 can be singulated and then an encapsulant mold (not shown) can be used to form and contain sides of the encapsulation 134 to have a vertical orientation with respect to the second side 1108.

The sides of the encapsulation 134 can be coplanar with the edges of the base panel 1002. Also shown are the plating bumps 1402 with the convex surface 1404, the layer 1406 with the edges 1408, and the second side 1108.

Figure 16:
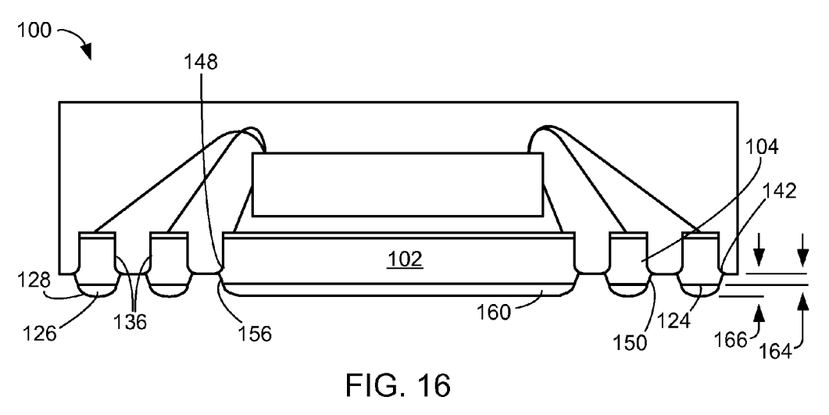
FIG. 16 is the structure of FIG. 15 in a back etching phase.

Referring now to FIG. 16, therein is shown the structure of FIG. 15 in a back etching phase. The base panel 1002 of FIG. 15 exposed around the plating bumps 1402 of FIG. 15 and the layer 1406 of FIG. 15 can be etched using the etching process to remove portions of the second side 1108 and the encapsulation 134 during the back etching phase.

The layer 1406 and the plating bumps 1402 limit removal of portions of the base panel 1002 over the layer 1406 and the plating bumps 1402 during the back etching phase. The portions of the base panel 1002 over the layer 1406 and the plating bumps 1402 unaffected by the back etching phase can have the panel thickness 1106 of FIG. 11.

As an example, copper material of the base panel 1002, covered by the plating bumps 1402 and the layer 1406 formed from the plating layer 1302 of FIG. 13, can be subjected to the back etching process. The back etching process can attack the plating bumps 1402 and the layer 1406 much less aggressively than the copper material exposed from the plating bumps 1402 and the layer 1406.

The chemical reaction equations specified in FIG. 9, description of the back etching phase, shows that an alkaline etchant in a controlled pH range will attack tin, solder, or nickel much less aggressively than the copper of the base panel 302. The base panel 1002 can be etched during the etching process to form the package leads 104, the die pad 102, and the minimum standoff height 164.

The package leads 104 include the outward sides 150 and the flared tip 142 of the inward sides 136. The die pad 102 includes the outward paddle sides 156 and the flared pad tip 148.

As a result of the much less aggressive etching of the tin, solder, or nickel, the plating bumps 1402 are formed into the bump contact 126 on the package leads 104 and the convex surface 1404 of FIG. 15 is formed into the bump convex surface 128 of the bump contact 126. Similarly, the layer 1406 is formed into the pad contact layer 160 as a result of the much less aggressive etching of the tin, solder, or nickel. The maximum standoff height 166 of the integrated circuit packaging system 100 is a result of the etching process applied to the base panel 1002 and the bump contact 126 formed from the plating bumps 1402.

The outward flat end 124 of the package leads 104 is formed from portions of the second side 1108 covered by the bump contact 126 and isolated by the attack of copper during the etching. The minimum standoff height 164 can be identical to the panel thickness 1106 of FIG. 11 as a result of the application of the plating bumps 1402 and the layer 1406 applied on the base panel 1002 and the controlled pH range of the etchant on copper covered with the plating layer 1302 during the etching process.

Figure 17:
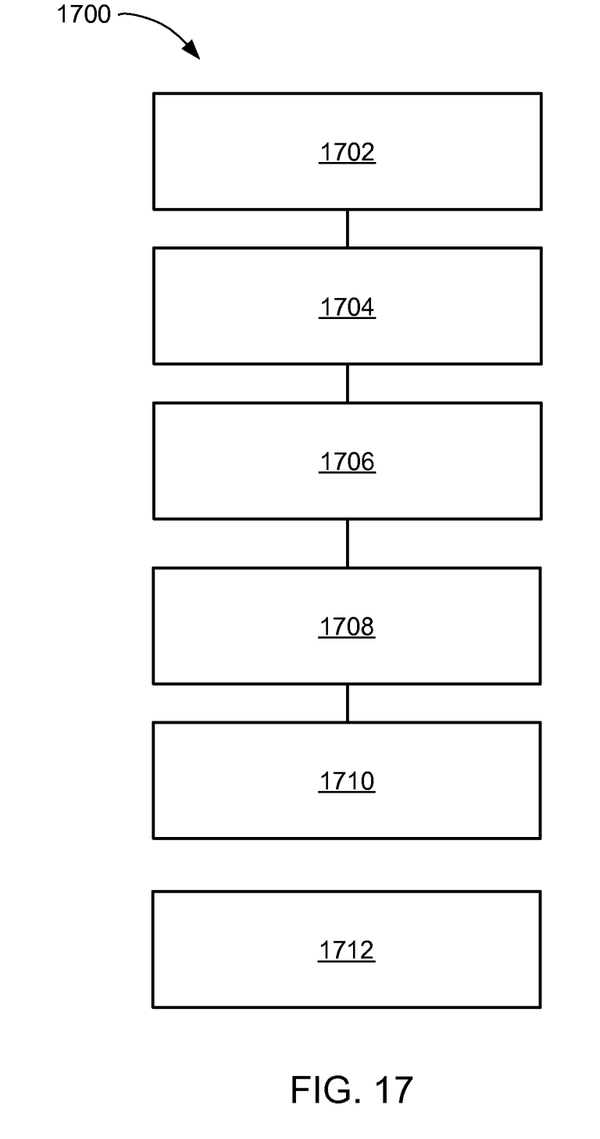
FIG. 17 is a flow chart of a method of manufacture of an integrated circuit packaging system in an embodiment of the present invention.

Referring now to FIG. 17, therein is shown is a flow chart of a method 1700 of manufacture of an integrated circuit packaging system in an embodiment of the present invention. The method 1700 includes providing a base panel having a first side with a cavity and a second side opposite the first side in a block 1702; connecting an integrated circuit device and the first side in a block 1704; applying a resist mask having an opening on the second side, the opening offset from the cavity in a block 1706; forming a bump contact in the opening in a block 1708; applying an encapsulation in the cavity over the integrated circuit device and the first side in a block 1710; and forming a package lead by removing a portion of the base panel under the cavity, a flared tip of the package lead intersecting a base side of the encapsulation in a block 1712.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a base panel having a first side with a cavity and a second side opposite the first side;
   connecting an integrated circuit device and the first side;

applying a resist mask having an opening on the second side, the opening offset from the cavity;

forming a bump contact in the opening, the bump contact having a bump convex surface;

applying an encapsulation in the cavity over the integrated circuit device and the first side; and forming a package lead by removing a portion of the base panel under the cavity, a flared tip of the package lead intersecting a base side of the encapsulation, and etching the base panel to form a maximum standoff height of the package lead from the base side.

2. The method as claimed in claim 1 further comprising removing the resist mask from the second side.

3. The method as claimed in claim 1 wherein forming the package lead includes etching a portion of the base panel from the second side to the cavity to expose the base side.

4. The method as claimed in claim 1 further comprising forming a die pad from the base panel.

5. A method of manufacture of an integrated circuit packaging system comprising:

providing a base panel having a first side with a cavity and a second side opposite the first side;

connecting an integrated circuit device and the first side;

applying a resist mask having an opening on the second side, the second side exposed in the opening offset from the cavity;

forming a bump contact on the second side in the opening, the bump contact having a bump convex surface;

removing the resist mask exposing the second side around the bump contact;

applying an encapsulation in the cavity and over the integrated circuit device and the first side; and forming a package lead by removing a portion of the base panel under the cavity, a flared tip of the package lead intersecting a base side of the encapsulation and the bump contact on the package lead, and etching the base panel to a maximum standoff height from the base side to the bump convex surface.

6. The method as claimed in claim 5 wherein providing the base panel having the first side with the cavity includes:

forming a pre-plated layer on the base panel; and forming the cavity in the base panel exposed by the pre-plated layer.

7. The method as claimed in claim 5 further comprising:

forming a die pad having a flared pad tip from the base panel; and mounting the integrated circuit device over the die pad.

\* \* \* \* \*